United States Patent
Park (10) Patent No.: US 9,905,202 B2
(45) Date of Patent: Feb. 27, 2018

(54) MEMORY DEVICE FOR A DISPLAY DEVICE HAVING VARIOUS IMAGE DATA INJECTION DIRECTIONS

(71) Applicant: Jeju Semiconductor Corp., Jeju-si, Jeju-do (KR)

(72) Inventor: Min Cheol Park, Yongin-si (KR)

(73) Assignee: JEJU SEMICONDUCTOR CORP., Jeju-si, Jeju-Do (KR)

( * ) Notice: Subject to any disclaimer, the term of this patent is extended or adjusted under 35 U.S.C. 154(b) by 55 days.

(21) Appl. No.: 15/254,080

(22) Filed: Sep. 1, 2016

(65) Prior Publication Data

US 2017/0069300 A1    Mar. 9, 2017

(30) Foreign Application Priority Data

Sep. 3, 2015  (KR) ........................ 10-2015-0124769

(51) Int. Cl.

| G09G 5/39 | (2006.01) |
|---|---|
| G06T 1/60 | (2006.01) |
| G09G 5/393 | (2006.01) |
| G11C 8/10 | (2006.01) |
| G11C 7/12 | (2006.01) |
| G09G 3/20 | (2006.01) |
| G09G 5/00 | (2006.01) |
| G09G 5/42 | (2006.01) |

(52) U.S. Cl.
CPC ............... *G09G 5/393* (2013.01); *G06T 1/60* (2013.01); *G09G 3/2096* (2013.01); *G11C 7/12* (2013.01); *G11C 8/10* (2013.01); *G09G 5/005* (2013.01); *G09G 5/42* (2013.01); *G09G 2360/18* (2013.01)

(58) Field of Classification Search
None
See application file for complete search history.

(56) References Cited

U.S. PATENT DOCUMENTS

| 2008/0122855 A1* | 5/2008 | Sonoyama | ............... G09G 3/20 345/531 |
| 2008/0297525 A1* | 12/2008 | Rai | ........................ G09G 3/003 345/534 |
| 2012/0127185 A1* | 5/2012 | Chowdhry | ............. G09G 5/393 345/531 |

* cited by examiner

*Primary Examiner* — James A Thompson
(74) *Attorney, Agent, or Firm* — Kile Park Reed & Houtteman PLLC (57) ABSTRACT

A memory device includes a row selection unit for selecting word lines of a memory array, a column selection unit for selecting data lines of the memory array, a last address storing unit for storing a last row address and a last column address, and a selection address generating unit for providing a row selection address and a column selection address to select the word lines and the data lines. In the memory device, start row and column addresses are determined based on the first and last row addresses, the first and last column addresses, the row section address and the column selection address and forwardly or backwardly counted based on directions corresponding to image data injection directions in a display panel to which the memory device provides the image data.

24 Claims, 9 Drawing Sheets

MEMORY DEVICE FOR A DISPLAY DEVICE HAVING VARIOUS IMAGE DATA INJECTION DIRECTIONS

CROSS-REFERENCE TO RELATED APPLICATION

This application claims priority to and the benefit of Korean Patent Application No. 10-2015-0124769, filed on Sep. 03, 2015, the disclosure of which is incorporated herein by reference in its entirety.

BACKGROUND

1. Field of the Invention

The present invention relates to a memory device for devices displaying images, and more particularly, to a memory device for a display device in which image data are injected in various directions.

2. Discussion of Related Art

A display device is operated to display screen images on a display panel. The display device is generally used in various electronic equipment such as note-book computers, smart-phones, etc. A screen image is displayed by supplying image data to pixels arranged at cross points of gate lines and source lines of the display panel.

Such display device generally includes a memory device (or a semiconductor memory device) for supplying the image data to the display panel. The semiconductor memory device includes a memory array including a plurality of memory cells which are arranged at cross points of word lines and data lines of the memory array. The image data are stored in the plurality of memory cells and transferred from the plurality of memory cells to the display panel.

The image data are serially injected to the pixels arranged at the cross points of a selected gate line and source lines of the display panel. The image data may be injected to the pixels of the display panel in various injection directions and/or sequences based on the orders of selecting the gate lines and the source lines of the display panel. Thus, it is required to provide the display panel with the image data in directions and/or sequences corresponding to the image data injection directions and/or sequences.

However, in cases that the number of data lines of the memory array is not matched with the number of source lines of the display panel, a mismatching of operation timing occurs between the semiconductor memory device and the display panel.

Therefore, it is desired that a memory device is improved so that the image data is properly provided to the display panel in various image data injection directions and/or sequences, and no mismatching of operation timing occur between the memory device and the display panel in cases that the number of data lines of the memory device is different than the number of source lines of the display panel.

SUMMARY OF THE INVENTION

The present invention is directed to a semiconductor memory device adaptable for a multi-style display device.

According to an aspect of the present invention, there is provided a memory device including a memory array that stores image data of pixels arranged at cross points of gate lines and source lines of a display panel, the memory array including a plurality of memory cells arranged at cross points of word lines and data lines of the memory array, a row selection unit that receives a row selection address and selects the word lines of the memory array corresponding to a row selection address, a column selection unit that receives a column selection address and selects the data lines of the memory array corresponding to a column selection address to input/output the image data of the selected data lines, a last address storing unit that stores a last row address and a last column address, wherein the last row address is the row selection address for selecting a word line of a memory cell storing image data of a pixel arranged at a cross point of a last gate line and a last source line, wherein the last column address is the column selection address for selecting a data line of a memory cell storing the image data of the pixel arranged at the cross point of the last gate line and the last source line, and a selection address generating unit that provides the row selection address and the column selection address to the row selection unit and the column selection unit, respectively, wherein the row selection address and the column selection address are based on an external row address and an external column address in a normal mode in which the memory cells are selected based on signals externally supplied, and the row selection address and the column selection address are based on the last row address and the last column address in an auto mode in which the memory cells are selected based on signals internally generated.

The selection address generating unit may include an auto address generating unit that generates an auto row address and an auto column address, wherein the auto row address and the auto column address are generated based on the last row address and the last column address provided from the last address storing unit, and an address selecting unit that generates the row selection address and the column selection address to the row selection unit and the column selection unit, respectively, the address selecting unit receiving a mode selection signal which is activated in the auto mode and not activated in the normal mode.

The address selecting unit may include a start row selection unit that generates a start row address based on the first row address, a row counter that receives and counts the start row address to generate the auto row address, a start column selection unit that generates a start column address based on the first column address, and a column counter that receives and counts the start column address to generate the auto column address.

BRIEF DESCRIPTION OF THE DRAWINGS

The above and other objects, features and advantages of the present invention will become more apparent to those of ordinary skill in the art by describing in detail exemplary embodiments thereof with reference to the accompanying drawings, in which.

DETAILED DESCRIPTION OF EXEMPLARY EMBODIMENTS

Exemplary embodiments of the present invention will be described in detail below with reference to the accompanying drawings. While the present invention is shown and described in connection with exemplary embodiments thereof, it will be apparent to those skilled in the art that various modifications can be made without departing from the spirit and scope of the present invention. Thus, the scope of the present invention is not limited to these particular following embodiments.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

It will be understood that, although the terms first, second, etc. may be used herein to describe various elements, these elements should not be limited by these terms. These terms are only used to distinguish one element from another, rather than ordering the elements. For example, a first element could be termed a second element, and, similarly, a second element could be termed a first element, without departing from the scope of the present invention.

In the present disclosure, a 'normal mode' is a mode in which the memory cells are selected based on signals (or address data) externally supplied. An 'auto mode' is a mode in which the memory cells are selected based on signals (or address data) internally generated.

In this exemplary embodiment of a semiconductor memory device of the present invention, the operation is performed in the auto mode when image data are provided to a display panel.

A semiconductor memory device according to an exemplary embodiment of the present invention will be described in detail with reference to the drawings.

Figure 1:
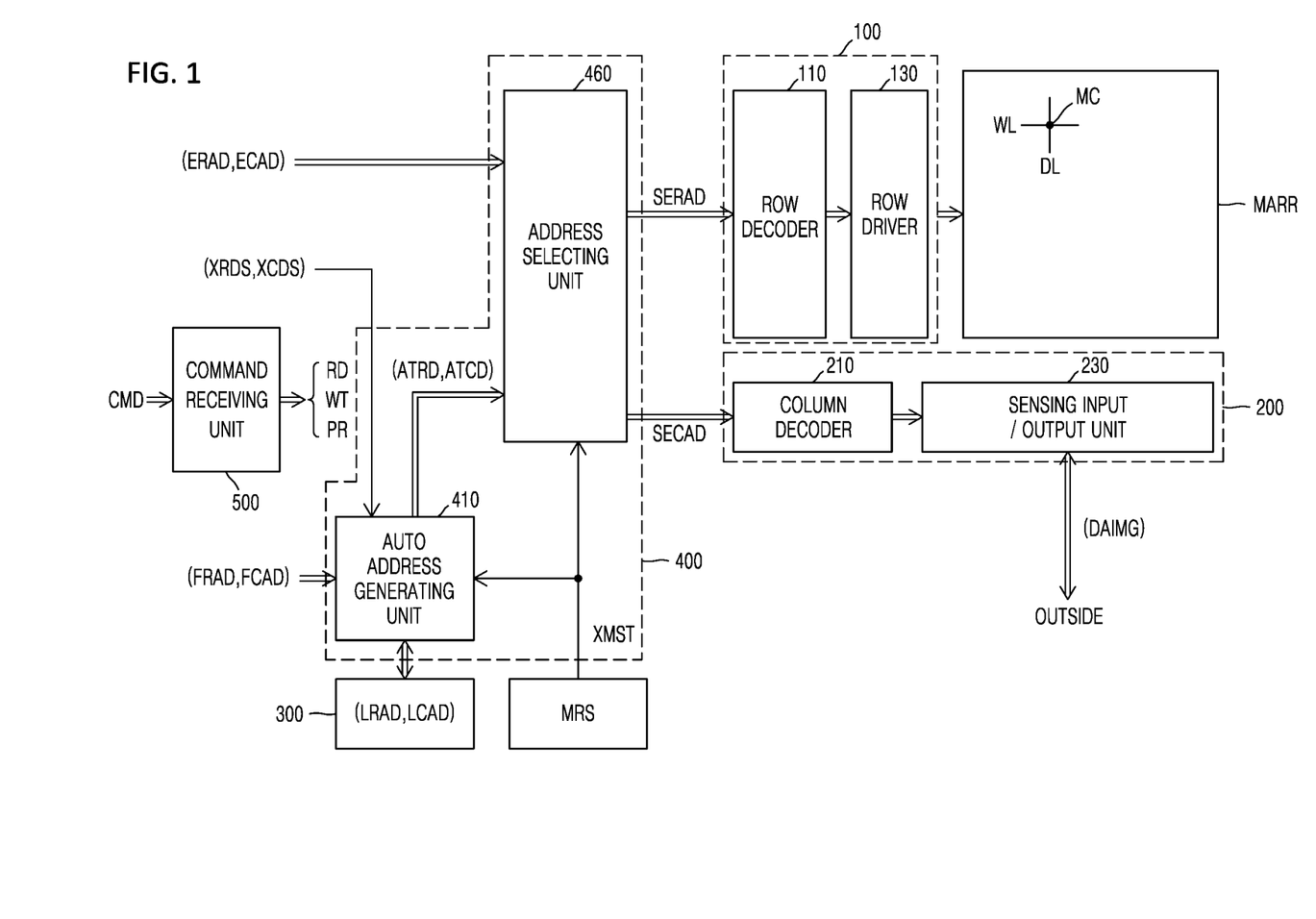
FIG. 1 is a block diagram of a semiconductor memory device according to an exemplary embodiment of the present invention.

FIG. 1 is a block diagram of a semiconductor memory device according to an exemplary embodiment of the present invention. Referring to FIG. 1, the semiconductor memory device includes a memory array MARR, a row selection unit 100, a column selection unit 200, a last address storing unit 300 and a selection address generating unit 400.

Figure 2:
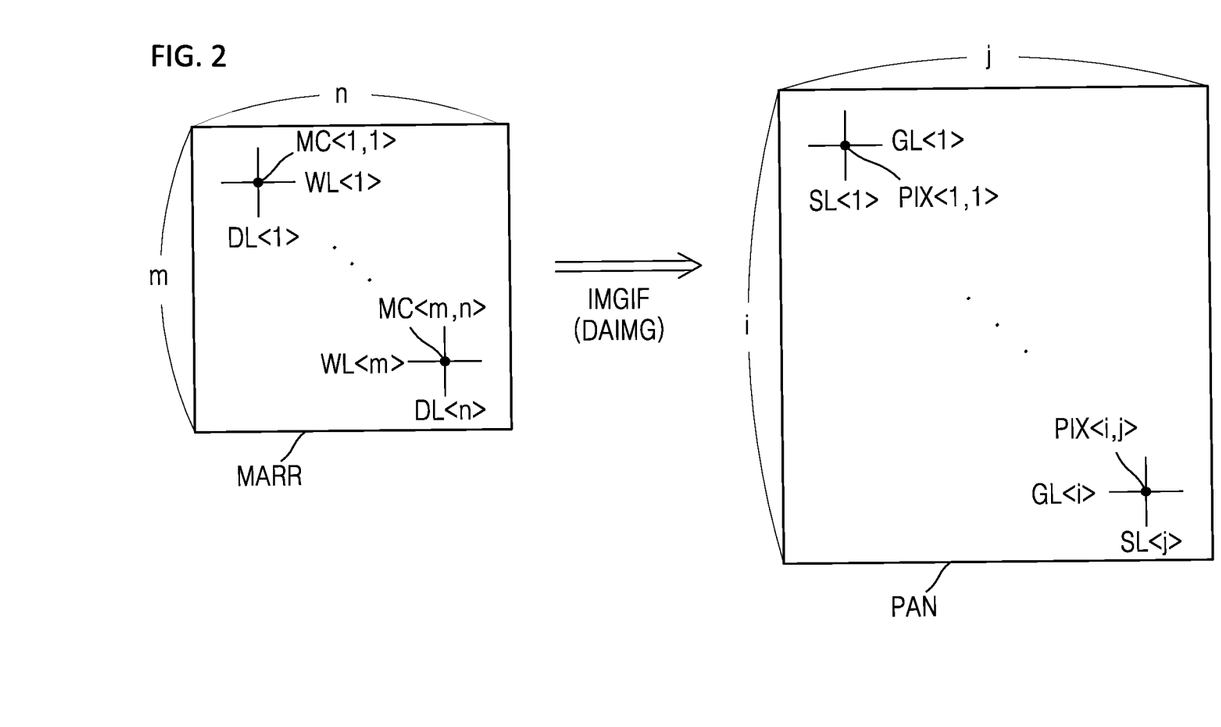
FIG. 2 is a drawing for explaining a relationship between a memory array of FIG. 1 and a display panel.

Referring to FIG. 2, the memory array MARR includes a plurality of memory cells MCs. The memory cells MCs are arranged at cross points of word lines WLs and data lines DLs. The word lines WLs have serial numbers 1 to m, and the data lines DLs have serial numbers 1 to n. Here, 'm' and 'n' are natural numbers which are greater than 1.

The memory cells MCs store image data DAIMG of pixels PIXs arranged at cross points of gate lines GLs and source lines SLs of a display panel PAN. The gate lines GLs have serial numbers 1 to i, and the source lines SLs have serial numbers 1 to j. Here, ' ' and 'j' are natural numbers which are greater than 1. In this exemplary embodiment, the image data DAIMG all the pixels PIXs of the display panel PAN consist of one frame of a screen image IMGIF.

Also, in this exemplary embodiment, the number j of the source lines SLs of the display panel PAN is greater than the number n of the data lines DLs of the memory array MARR. However, the present invention is not limited to this exemplary embodiment. The inventive concepts of the present invention can be applicable to a display device where the number of source lines of a display panel is equal to or smaller than the number of data lines of a memory array.

Figure 3:
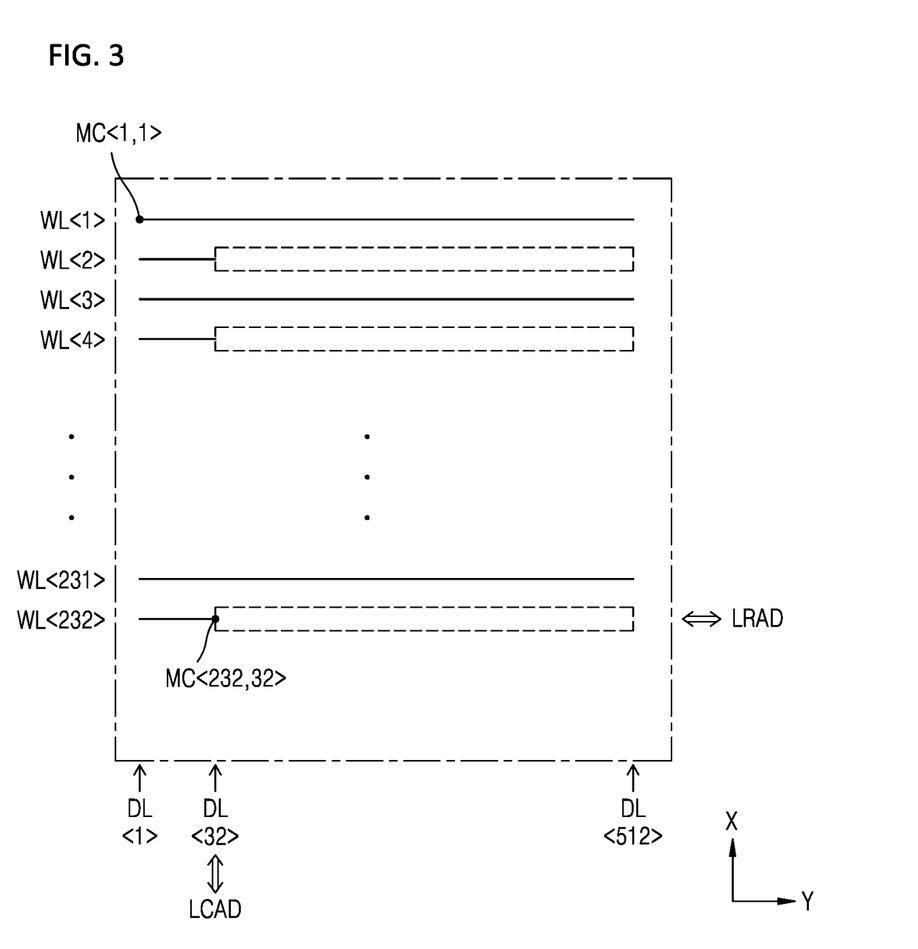
FIG. 3 is a drawing for explaining memory cells storing image data in the memory array of FIG. 1.

In this embodiment, the image data DAIMG of one gate line GL of the display panel PAN are stored in the memory cells MCs of multiple word lines WLs, as shown in FIG. 3.

In FIG. 3, the image data DAIMG of a first gate line (or a gate line with the first serial number) GL<1> in the display panel PAN are stored in the memory cells MCs of a first word line (or a word line with the first serial number) WL<1> and the second word line WL<2> of the memory array MARR. The image data DAIMG of the second gate line GL<2> in the display panel PAN are stored in the memory cells MCs of the third word line WL<3> and the forth word line WL<4> of the memory array MARR.

In FIG. 3, the areas depicted with dotted lines represent the memory cells in which no image data is stored.

The structure of the memory array MARR can be a single-bank structure, as shown in FIG. 3. In this structure, the word lines are numbered in series such as WL<1>, WL<2>, . . . ,WL<232>.

Figure 4:
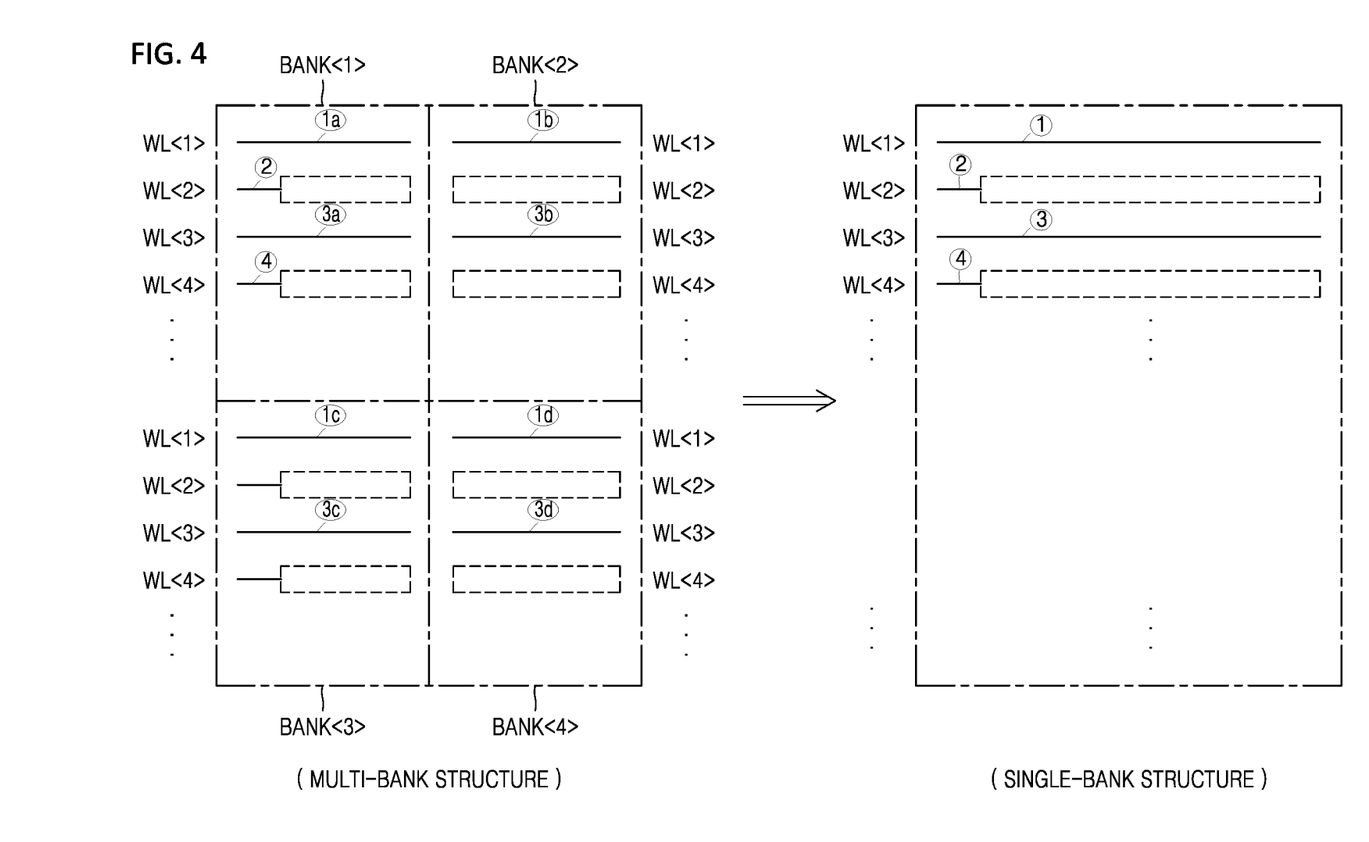
FIG. 4 is a drawing showing a single-bank structure and a multi-bank structure of a memory array.

Also, the structure of the memory array MARR can be a multi-bank structure, as shown in FIG. 4. In this structure, the word lines are numbered in a same matter in each of the memory banks BANK<1, 2, 3, 4>. Each of the memory banks can be selected by a bank address.

In the embodiment of FIG. 4, the image data DAIMG of one gate line GL are stored in the memory cells MC of multiple world lines WLs in the four memory banks. For example, the first word line WL<1> in the single-bank structure is corresponding to the first word lines WL<1> (referring to 1a, 1b, 1c and 1d of FIG. 4,) in the four memory banks.

In the multi-bank structure, the serial number of data lines DL is given in order of the first memory bank BANK<1>, the second memory bank BANK<2>, the third memory bank BANK<3> and the forth memory bank BANK<4>.

Referring to FIG. 4, the areas depicted with dotted lines represent the memory cells having no image data DAIMG.

Referring back to FIG. 1, the row selection unit 100 is driven to select the word lines WLs of the memory array MARR corresponding to a row selection address SERAD.

The row selection unit 100 includes a row decoder 110 and a row driver 130. The row decoder 100 decodes the row selection address SERAD. The row driver 110 is driven to select the word lines WLs of the memory array MARR corresponding to the address decoded by the row decoder 110.

The column selection unit 200 is driven to select the data lines DLs of the memory array MARR corresponding to a column selection address SECAD. The column selection unit 200 is driven to input/output the image data DAIMG of the selected data line DL.

The column selection unit 200 includes a column decoder 210 and a sensing input/output unit 230. The column decoder 210 decodes the column selection address SECAD. The sensing input/output unit 230 is driven to select the data line DL of the memory array MARR corresponding to the address decoded by the column decoder 310. The sensing input/output unit 230 is driven to input/output the image data DAIMG of the selected data line DL.

The last address storing unit 300 stores a last row address LRAD and a last column address LCAD. Herein, the last row address LRAD is the row selection address SERAD for selecting a word line of the memory cell MC storing the image data DAIMG of the last pixel PIX<i,j> arranged at the cross point of a last gate line (or a gate line with the last serial number) GL<i> and a last source line (or a source line with the last serial number) SL<j>. The last column address LCAD is the column selection address SECAD for selecting a data line of the memory cell MC storing the image data DAIMG of the last pixel PIX<i,j> arranged at the cross point of the last gate line GL<i> and the last source line SL<j>.

Referring back to FIG. 3, the last row address LRAD is the row selection address SERAD for selecting the word line WL<232>. The last column address LCAD is the column selection address SECAD for selecting the data line DL<32>.

Referring back to FIG. 1, the selection address generating unit 400 generates the row selection address SERAD and the column selection address SECAD. Herein, the row selection address SERAD and the column selection address SECAD are based on an external row address ERAD and an external column address ECAD in a normal mode. In the normal mode, a mode selection signal XMST is not activated. The row selection address SERAD and the column selection address SECAD are based on the last row address LRAD and the last column address LCAD in an auto mode. In the auto mode, the mode selection signal XMST is activated.

The selection address generating unit 400 comprises an auto address generating unit 410 and an address selecting unit 460.

The auto address generating unit 410 generates an auto row address ATRD and an auto column address ATCD. Herein, the auto row address ATRD and the auto column address ATCD are based on the last row address LRAD and the last column address LCAD.

The address selecting unit 460 generates the row selection address SERAD and the column selection address SECAD. Herein, the row selection address SERAD and the column selection address SECAD are based on the external row address ERAD and the external column address ECAD in the normal mode. The row selection address SERAD and the column selection address SECAD are based on the auto row address ATRD and the auto column address ATCD in the auto mode.

The auto row address ATRD and the auto column address ATCD are described in detail.

Figure 5:
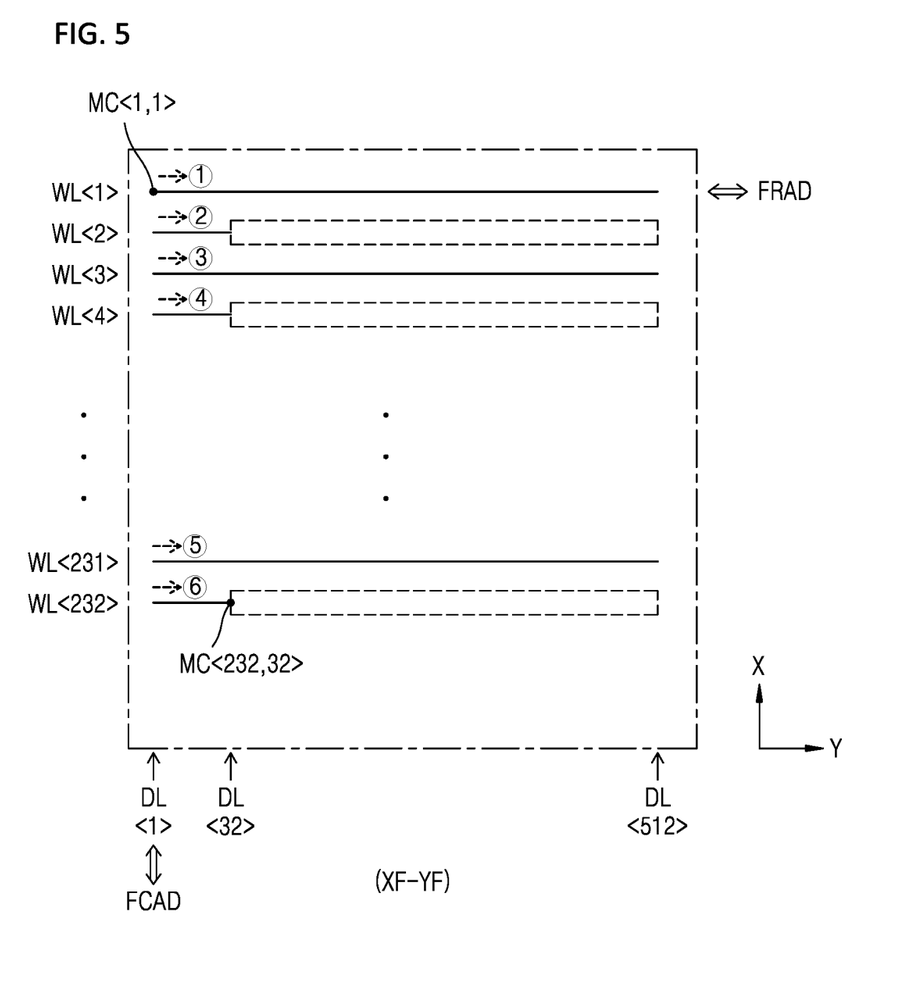
FIG. 5 to FIG. 8 are drawings for explaining various orders of selecting word lines and data lines of the memory array.

FIG. 5 is a drawing for explaining orders of selecting the word lines and the data lines of the memory array when the display panel PAN is operated with a forward row-forward column operation XF-YF. In the forward row-forward column operation XF-YF, a row backward signal XRDS and a column backward signal XCDS are not activated.

In the forward row-forward column operation XF-YF of FIG. 5, the auto row address ATRD is generated with forward counting from a first row address FRAD. Herein, the first row address FRAD is the row selection address SERAD corresponding to the first word line WL<1>.

In the forward row-forward column operation XF-YF of FIG. 5, the auto column address ATCD is generated with forward counting from a first column address FCAD. Herein, the first column address FCAD is the column selection address SECAD corresponding to a first data line (or a data line with the first serial number) DL<1>.

The forward row-forward column operation XF-YF of FIG. 5 may be implemented in a display device which displays screen images by injecting image data in a X-forward and Y-forward injection direction.

Figure 6:
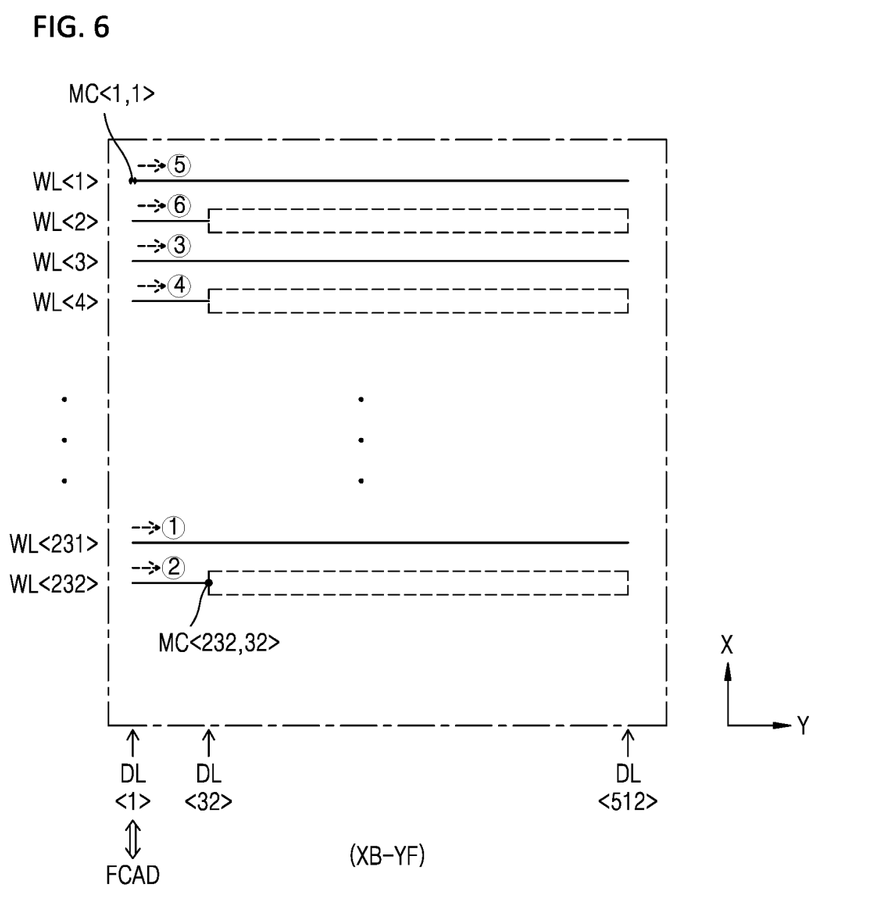

FIG. 6 is a drawing for explaining orders of selecting the word lines and the data lines of the memory array when the display panel PAN is operated with a backward row-forward column operation XB-YF. In the backward row-forward column operation XB-YF, the row backward signal XRDS is activated, and the column backward signal XCDS is not activated.

In the backward row-forward column operation XB-YF of FIG. 6, the auto row address ATRD is generated with backward counting from the row selection address SERAD corresponding to the word lines WL<231>, WL<232> of the memory cells MCs corresponding to the pixels PIXs of the last gate line GL<i>.

As illustrated in FIG. 6, as to the multiple (for example, two) word lines of the memory cells storing image data of pixels of one gate line, the auto row address ATRD is generated with forward counting from the row selection address SERAD corresponding to a word line of the memory cell MC storing the image data DAIMG of the pixel arranged at a cross point of a first source line (or a source line with the first serial number) SL<1> and the one gate line.

In the backward row-forward column operation XB-YF of FIG. 6, the auto column address ATCD is generated with forward counting from the first column address FCAD.

The backward row-forward column operation XB-YF of FIG. 6 is adoptable for the display device which displays the screen image with X-backward and Y-forward injection.

Figure 7:
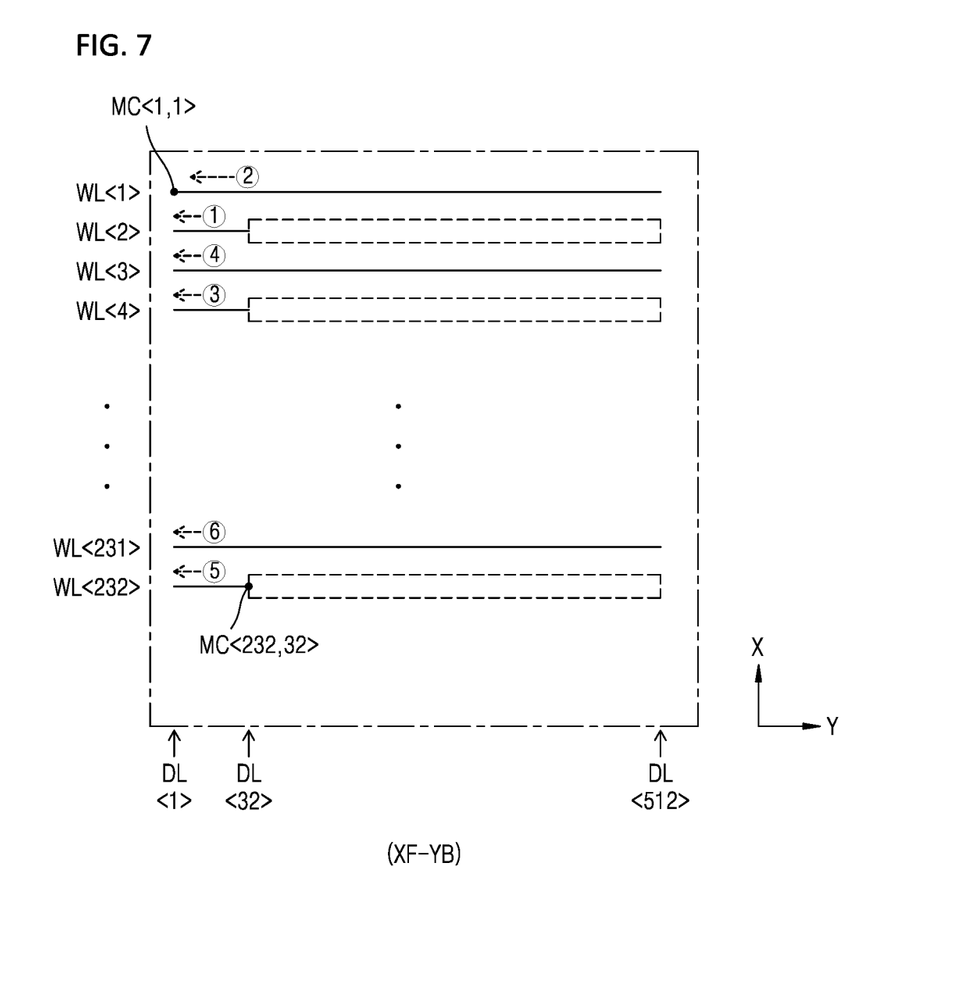

FIG. 7 is a drawing for explaining orders of selecting the word lines and the data lines of the memory array when the display panel PAN is operated with a forward row-backward column operation XF-YB. In the forward row-backward column operation XF-YB, a row backward signal XRDS is not activated, and a column backward signal XCDS is activated.

In the forward row-backward column operation XF-YB of FIG. 7, the auto row address ATRD is generated with forward counting from the row selection address SERAD corresponding to the word lines WL<1>, WL<2> of the memory cells MCs corresponding to the pixels PIXs of the first gate line GL<1>.

As illustrated in FIG. 7, as to the multiple (for example, two) word lines of the memory cells storing image data of pixels of one gate line, the auto row address ATRD is generated with backward counting from the row selection address SERAD corresponding to a word line of the memory cell MC storing the image data DAIMG of the pixel arranged at a cross point of the last source line SL<j> and the one gate line.

In the forward row-backward column operation XF-YB of FIG. 7, the auto column address ATCD is generated with backward counting from the last column address LCAD with respect to the word-lines (for example, WL<2>, WL<4>, . . . , and WL<232>) of the memory cells MCs corresponding to the pixels PIXs arranged at the last source line SL<j>.

Also, the auto column address ATCD is generated with backward counting from the column selection address SECAD selecting a last data line (or a data line with the last serial number) DL<512> with respect to the word-lines (for example, WL<1>, WL<3>, . . . , and WL<231>) of the memory cells MCs not corresponding to the pixels PIXs arranged at the last source line SL<j>.

The forward row-backward column operation XF-YB of FIG. 7 may be implemented in a display device which displays the screen images by injecting image date in a X-forward and Y-backward injection direction.

Figure 8:
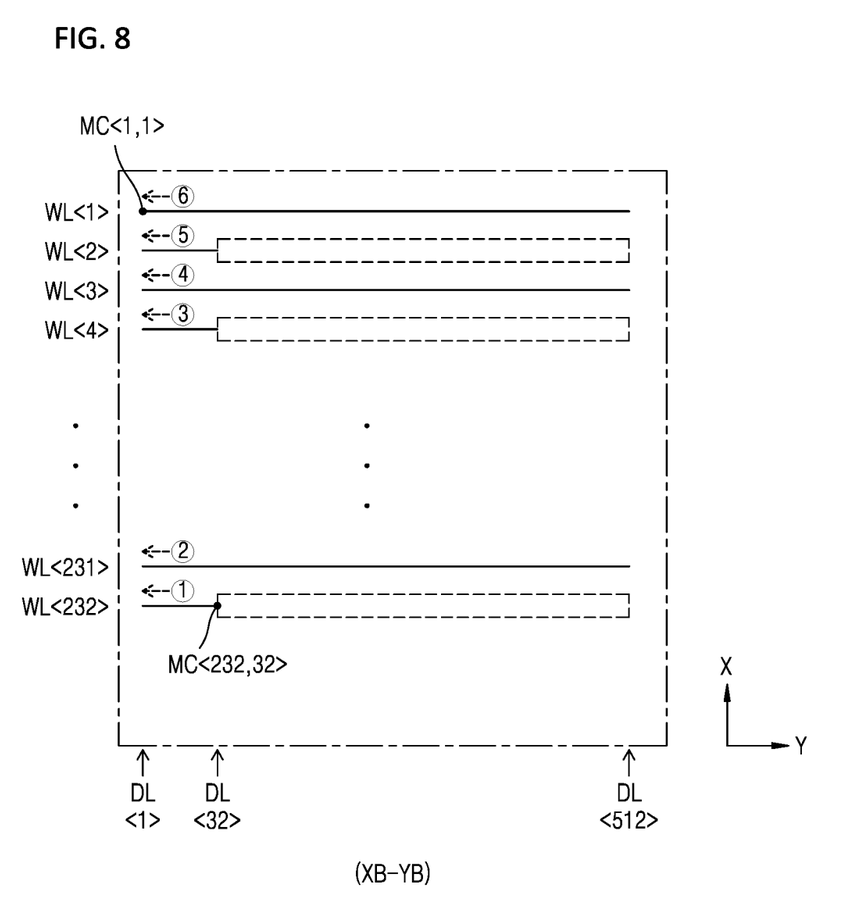

FIG. 8 is a drawing for explaining orders of selecting the word lines and the date lines of the memory array when the display panel PAN is operated with a back row-back column operation XB-YB. In the back row-back column operation XB-YB, the row backward signal XRDS and the column backward signal XCDS are activated.

In the back row-back column operation XB-YB of FIG. 8, the auto row address ATRD is generated with backward counting from the last row address LRAD. Herein, the last row address LRAD is the row selection address SERAD selecting a last word line (a word line with the last serial number) WL<232> of memory cell(s) storing the image data DAIMG.

In the back row-back column operation XB-YB of FIG. 8, the auto column address ATCD is generated with backward counting from the last column address LCAD with respect to the word-lines (for example, WL<2>, WL<4>, . . . , and WL<232>) of the memory cells MCs corresponding to the pixels PIXs arranged at the last source line SL<j>.

Also, the auto column address ATCD is generated with backward counting from the column selection address SECAD selecting the last data line DL<512> with last serial number with respect to the word-lines (for example, WL<1>, WL<3>, . . . , and WL<231>) of the memory cells MCs not corresponding to the pixels PIXs arranged at the last source line SL<j>.

The back row-back column operation XB-YB of FIG. 8 may be implemented in a display device which displays the screen images by injecting image data in a X-backward and Y-backward injection direction.

As described above, the semiconductor memory device of the present invention can perform various operations in terms of the directions of selecting word lines and the data lines of a memory array that stores image data to be provided to a display panel. Accordingly, the semiconductor memory device of the present invention can be effectively implemented in a display device in which image data injection is performed in various directions.

Figure 9:
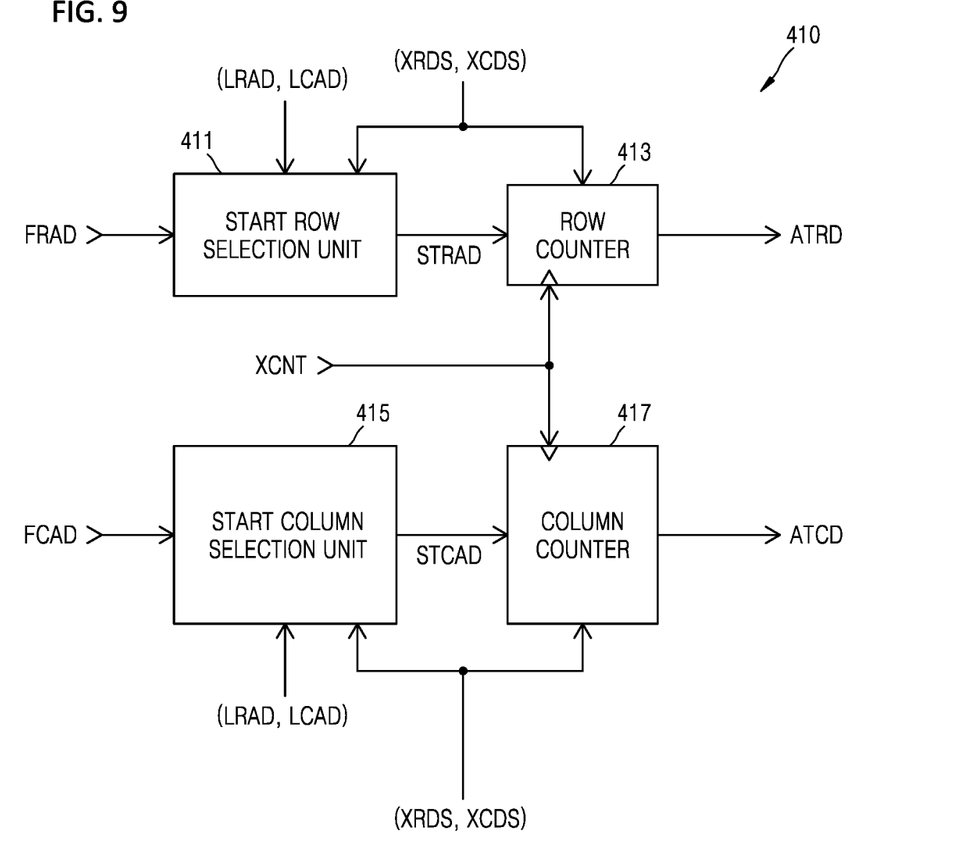
FIG. 9 is a block diagram illustrating an exemplary embodiment of an auto address generating unit of FIG. 1.

FIG. 9 is a block diagram showing an exemplary embodiment of the auto address generating unit 410 according to the present invention.

Referring to FIG. 9, the auto address generating unit 410 comprises a start row selection unit 411, a row counter 413, a start column selection unit 415 and a column counter 417.

The start row selection unit 411 generates a start row address STRAD based on the first row address FRAD. The row counter 413 generates the auto row address ATRD with counting the start row address STRAD. The start column selection unit 415 generates a start column address STCAD based on the first column address FCAD. The column counter 417 generates the auto column address ATCD with counting the start column address STCAD.

The start row selection unit 411 monitors the first row address FRAD and the start column selection unit 415 monitors the first column address FCAD.

In FIG. 9, the signal XCNT is a signal for counting the memory cells. The signal XCNT can be provided externally or generated internally.

The start row address STRAD and the start column address STCAD are described in detail.

In the forward row-forward column operation XF-YF of FIG. 5, the start row address STRAD is the first row address FRAD.

In the backward row-forward column operation XB-YF of FIG. 6, the start row address STRAD is the row selection address SERAD corresponding to the word lines of the memory cells MCs corresponding to the pixels PIXs of the last gate line GL<i>.

As shown FIG. 6, the start row address STRAD is the row selection address SERAD corresponding to the word lines WL<231><232> of the memory cells MCs storing the image data DAIMG of the pixels arranged at cross points of the first source line SL<1> with respect to the word lines WLs of memory cells storing image data of pixels of one gate line GL<i>.

In the forward row-forward column operation XF-YF of FIG. 5 and in the backward row-forward column operation XB-YF of FIG. 6, the start column address STCAD is the first column address FCAD.

In the forward row-backward column operation XF-YB of FIG. 7, the start row address STRAD is the row selection address SERAD corresponding to the word lines of the memory cells MCs corresponding to the pixels PIXs arranged at the first gate line GL<1>.

With respect to the word lines of the memory cells storing image data of pixels of one gate line, the start row address STRAD is the row selection address SERAD corresponding to the word lines WL<2> of the memory cell MC storing the image data DAIMG of the pixel arranged at a cross point of the last source line SL<j> and the one gate line.

In the backward row-backward column operation XB-YB of FIG. 8, the start row address STRAD is the last row address LRAD.

In the forward row-backward column operation XF-YB of FIG. 7 and in the backward row-backward column operation XB-YB of FIG. 8, the start column address STCAD is the last column address LCAD with respect to the word lines (for example, WL<2>, WL<4>, . . . , and WL<232>) of the memory cells MCs corresponding to the pixels arranged at the last source line SL<j>.

Also, the start column address STCAD is the column selection address SECAD selecting the last data line DL<512> with respect to the word lines (for example, WL<1>, WL<3>, . . . , and WL<231>) of the memory cells MCs not corresponding to the pixels PIXs arranged at the last source line SL<j>.

Referring back to FIG. 1, the address selecting unit 460 in the selection address generating unit 400 generates the row selection address SERAD and the column selection address SECAD.

The row selection address SERAD and the column selection address SECAD are based on the external row address ERAD and the external column address ECAD in the normal mode. Also, the row selection address SERAD and the column selection address SECAD are based on the auto row address ATRD and the auto column address ATCD in the auto mode.

In this embodiment, the semiconductor memory device of the present invention may include a mode register unit MRS. The mode register unit MRS generates the mode selection signal XMST according to a command or by cutting fuses.

Also, the row backward signal XRDS and the column backward signal XCDS may be configured to be a part of the external row address ERAD and the external column address ECAD. In this embodiment, providing more pins for the row backward signal XRDS and the column backward signal XCDS is not necessitated.

When the memory array has the multi-bank structure, the row backward signal XRDS and the column backward signal XCDS may be configured to be a part of the external row address ERAD and the external column address ECAD for selecting one of the multiple memory banks.

In FIG. 1, a command receiving unit 500 receives a command CMD from outside, and controls the semiconductor memory device to perform a write operation WT, a read operation RD and a pre-charge operation PR.

It will be apparent to those skilled in the art that various modifications can be made to the above-described exemplary embodiments of the present invention without departing from the spirit or scope of the invention. Thus, it is intended that the present invention covers all such modifications provided they come within the scope of the appended claims and their equivalents.

What is claimed is:

1. A memory device for a display device having various image data injection directions, the memory device comprising:
   a memory array that stores image data of pixels arranged at cross points of gate lines and source lines of a display panel, the memory array including a plurality of memory cells arranged at cross points of word lines and data lines of the memory array;
   a row selection unit that receives a row selection address and selects the word lines of the memory array corresponding to the row selection address;
   a column selection unit that receives a column selection address and selects the data lines of the memory array corresponding to the column selection address to input/output the image data of the selected data lines;
   a last address storing unit that stores a last row address and a last column address, wherein the last row address is the row selection address for selecting a word line of a memory cell storing image data of a pixel arranged at a cross point of a last gate line and a last source line, and the last column address is the column selection address for selecting a data line of a memory cell storing the image data of the pixel arranged at the cross point of the last gate line and the last source line; and
   a selection address generating unit that provides the row selection address and the column selection address to the row selection unit and the column selection unit, respectively, wherein the row selection address and the column selection address are generated based on an external row address and an external column address in a normal mode in which the memory cells are selected based on signals externally supplied, and the row selection address and the column selection address are generated based on the last row address and the last column address in an auto mode in which the memory cells are selected based on signals internally generated.

2. The memory device of claim 1, wherein the selection address generating unit comprises:
   an auto address generating unit that generates an auto row address and an auto column address, wherein the auto row address and the auto column address are generated based on the last row address and the last column address provided from the last address storing unit; and
   an address selecting unit that generates the row selection address and the column selection address to the row selection unit and the column selection unit, respectively, the address selecting unit receiving a mode selection signal which is activated in the auto mode and not activated in the normal mode.

3. The memory device of claim 2, wherein the auto row address is generated with forward counting from an first row address at a forward row-forward column operation in which a row backward signal and a column backward signal are not activated, and wherein the first row address is the row selection address corresponding to a first word-line of the memory array.

4. The memory device of claim 3, wherein the auto column address is generated with forward counting from a first column address at the forward row-forward column operation, and wherein the first column address is the column selection address corresponding to a first data line of the memory array.

5. The memory device of claim 2, wherein the auto row address is generated with backward counting from the row selection address corresponding to the word lines of the memory cells corresponding to pixels of the last gate line at a backward row-forward column operation in which the row backward signal is activated and the column backward signal is not activated.

6. The memory device of claim 5, wherein, with respect to the word lines of the memory cells corresponding to pixels of the last gate line, the auto row address is generated with forward counting from the row selection address corresponding to a word line of a memory cell storing image data of a pixel arranged at a cross point of a first source line.

7. The memory device of claim 5, wherein the auto column address is generated with forward counting from a first column address at the backward row-forward column operation, and wherein the first column address is the column selection address corresponding to a first data line of the memory array.

8. The memory device of claim 2, wherein the auto row address is generated with forward counting from a row selection address corresponding to the word lines of the memory cells corresponding to pixels of a first gate line at a forward row-backward column operation in which the row backward signal is not activated and the column backward signal is activated.

9. The memory device of claim 8, wherein, with respect to the word lines of the memory cells corresponding to pixels of the first gate line, the auto row address is generated with backward counting from the row selection address corresponding to a word line of a memory cell storing image data of a pixel arranged at a cross point of the last source line.

10. The memory device of claim 8, wherein the auto column address is generated with backward counting from the last column address with respect to the word lines of the memory cells corresponding to pixels of the last source line.

11. The semiconductor memory device of claim 8, wherein the auto column address is generated with backward counting from the column selection address selecting the last data line with respect to the word lines of the memory cells not corresponding to pixels of the last source line.

12. The memory device of claim 2, wherein the auto row address is generated with backward counting from the last row address at a backward row-backward column operation in which the row backward signal and the column backward signal are activated.

13. The memory device of claim 12, wherein the auto column address is generated with backward counting from the last column address with respect to the word lines of the memory cells corresponding to pixels of the last source line.

14. The memory device of claim 12, wherein auto column address is generated with backward counting from the column selection address selecting the last data line with respect to the word lines of the memory cells not corresponding to pixels of the last source line.

15. The memory device of claim 2, wherein the address selecting unit comprises:

a start row selection unit that generates a start row address based on the first row address;

a row counter that receives and counts the start row address to generate the auto row address;

a start column selection unit that generates a start column address based on the first column address; and a column counter that receives and counts the start column address to generate the auto column address.

16. The memory device of claim 15, wherein the start row address is the first row address at a forward row-forward column operation.

17. The memory device of claim 15, wherein the start row address is the row selection address the word lines of the memory cells corresponding to pixels on the last gate line at a backward row-forward column operation.

18. The memory device of claim 17, wherein, with respect to the word lines of the memory cells corresponding to pixels of the last gate line, the start row address is the row selection address corresponding to a word line of a memory cell storing image data of a pixel arranged at a cross point of a first source line.

19. The memory device of claim 15, wherein the start row address is the row selection address corresponding to the word lines of the memory cells corresponding to pixels of a first gate line at a forward row-backward column operation.

20. The memory device of claim 19, wherein, with respect to the word lines of the memory cells corresponding to pixels of the first gate line, the start row address is the row selection address corresponding to a word line of a memory cell storing image data of a pixel arranged at a cross point of the last source line.

21. The memory device of claim 15, wherein the start row address is the last row address at a backward row-backward column operation.

22. The memory device of claim 15, wherein the start column address is a first column address at a forward row-forward column operation and a backward row-forward column operation.

23. The memory device of claim 15, wherein the start column address is the last column address with respect to the word lines of the memory cells corresponding to pixels of the last source line at a forward row-backward column operation and a backward row-backward column operation.

24. The memory device of claim 15, wherein the start column address is the column selection address selecting the last data line with respect to the word lines of the memory cells not corresponding to pixels on the last source line at a forward row-backward column operation and a backward row-backward column operation.

* * * * *